United States Patent [19]

Kato et al.

[11] Patent Number: 5,081,682
[45] Date of Patent: Jan. 14, 1992

[54] ON-VEHICLE AUTOMATIC LOUDNESS CONTROL APPARATUS

[75] Inventors: Shinjiro Kato; Fumio Tamura; Masayaki Kato, all of Saitama, Japan

[73] Assignee: Pioneer Electronic Corporation, Tokyo, Japan

[21] Appl. No.: 530,535

[22] Filed: May 30, 1990

[30] Foreign Application Priority Data

Jun. 1, 1989 [JP] Japan .................... 1-137394

[51] Int. Cl.⁵ .................... H03G 3/20
[52] U.S. Cl. .................... 381/57; 381/108; 381/86
[58] Field of Search .................... 381/57, 108, 86

[56] References Cited

U.S. PATENT DOCUMENTS

| | | | |
|---|---|---|---|
| 3,814,856 | 6/1974 | Dugan | 381/57 |
| 4,061,874 | 12/1977 | Fricke et al. | 381/57 |
| 4,406,923 | 9/1983 | Burne, III et al. | 381/108 |
| 4,553,257 | 11/1985 | Mori et al. | 381/57 |
| 4,628,526 | 12/1986 | Germer | 381/57 |
| 4,953,221 | 8/1990 | Holly et al. | 381/108 |

Primary Examiner—Forester W. Isen
Attorney, Agent, or Firm—Sughrue, Mion, Zinn Macpeak & Seas

[57] ABSTRACT

An on-vehicle automatic loudness control apparatus according to the present invention comprises a volume control circuit for receiving an audio signal from an audio signal source, the volume control circuit controlling an output level therefrom in accordance with a first signal supplied thereto; a level detecting unit for receiving the output level from volume control circuit, the level detector controlling an output level therefrom in accordance with a second signal supplied thereto, a noise detecting unit for detecting environmental noise in a passenger space of a car to output a noise signal in accordance with the environmental noise level; a relative level detecting circuit for comparing the output level from the level detector with the noise signal to output a third signal indicative of a relative magnitude between the output level from the level detector and the noise signal; and a control circuit for outputting the first signal and the second signal in accordance with the third signal. The second signal causes the output level from level detector to decrease when the output level of the volume control circuit is increased, and the second signal causes the output from level detector to increase when the output level from volume control circuit is decreased.

2 Claims, 2 Drawing Sheets

5,081,682

ON-VEHICLE AUTOMATIC LOUDNESS CONTROL APPARATUS

BACKGROUND OF THE INVENTION

1. Field of the Invention

The present invention relates to an on-vehicle automatic loudness control apparatus used in on-vehicle audio equipment.

2. Prior Art

In on-vehicle audio equipment, the reproduced audio signal is often faint in the background of engine noise and so-called road noise developed by the tires running on road surfaces. There have been available audio equipment adapted to automatically control the loudness of the output in accordance with the environmental noise in a passenger space.

FIG. 2 shows one such type of on-vehicle automatic loudness control apparatus which includes a signal source H such as a tuner or a tape player and an adapter A for automatically controlling the loudness. The head unit H includes primarily an audio signal source 1 of an audio signal reproduced through the tape player or the tuner and a first volume control circuit 2 for controlling the audio output level from the signal source 1. A microphone 3 is disposed at a suitable location in the car room to detect the noise. A lowpass filter 4 amplifies the output from the microphone 3 and extracts only the low frequency components. The output of the filter 4 is supplied to a noise detector 5 which provides a dc signal indicative of the level of the noise. An audio signal detector 7 receives the output of the volume control circuit 2 and provides a dc signal indicative of the level of the audio signal. A relative level detection circuit (subtracter) 8 compares the level of the output of detector 7 with that of the noise detector 5 to output a relative output, which in turn is converted into a digital signal by an A/D converter 9. Then, the output of the A/D converter 9 is fed to a microprocessor 10 which provides a volume-controlling signal. A second volume control circuit 12 receives the output from the first volume control circuit 2 and controls the output signal level from the volume control circuit 2 in accordance with the volume-controlling signal.

With the prior art automatic loudness control apparatus of the above-described construction, the volume control circuit 2 is controlled by the user to set the input level to the volume control circuit 12. This set level determines a desired speaker output level. The volume control circuit 12 is controlled by the microprocessor 10 in accordance with the output of the relative level detection circuit 8 such that the output of the circuit 12 is adjusted back and forth through an output level corresponding to the input level thereto. Thus, the output from the speaker is adjusted back and forth through the desired speaker output level in accordance with the environmental noise level.

It should be noted that the audio signal goes through the two volume control circuits connected in series, usually of an electronic type. These circuits must be of a low noise type and also must not produce so-called pop noise when operated to control audio signal level therethrough. Such circuits are necessarily expensive.

SUMMARY OF THE INVENTION

An object of the invention is to provide an on-vehicle volume control apparatus which provides a noise-free and distortion-free audio output signal at a low cost.

An on-vehicle automatic loudness control apparatus according to the present invention comprises:

a volume control means for receiving an audio signal from an audio signal source, the volume control means controlling an output level therefrom in accordance with a first signal supplied thereto;

a level detecting means for receiving the output level from the volume control means, the level detecting means controlling an output level therefrom in accordance with a second signal supplied thereto;

a noise detecting means for detecting environmental noise in a passenger space of a car to output a noise signal in accordance with the environmental noise level;

a relative level detecting means for comparing the output level from the level detecting means with the noise signal to output a third signal indicative of a relative magnitude between the output level from the level detecting means and the noise signal; and a control means for outputting the first signal and the second signal in accordance with the third signal;

wherein the second signal causes the output level from the level detecting means to decrease when the output level of the volume control means is increased, and the second signal causes the output from the level detecting means to increase when the output level from the volume control means is decreased.

BRIEF DESCRIPTION OF THE DRAWINGS

Features and other objects of the invention will be more apparent from the description of the preferred embodiments with reference to the accompanying drawings in which.

DETAILED DESCRIPTION OF THE PREFERRED EMBODIMENTS

Example

Figure 1:
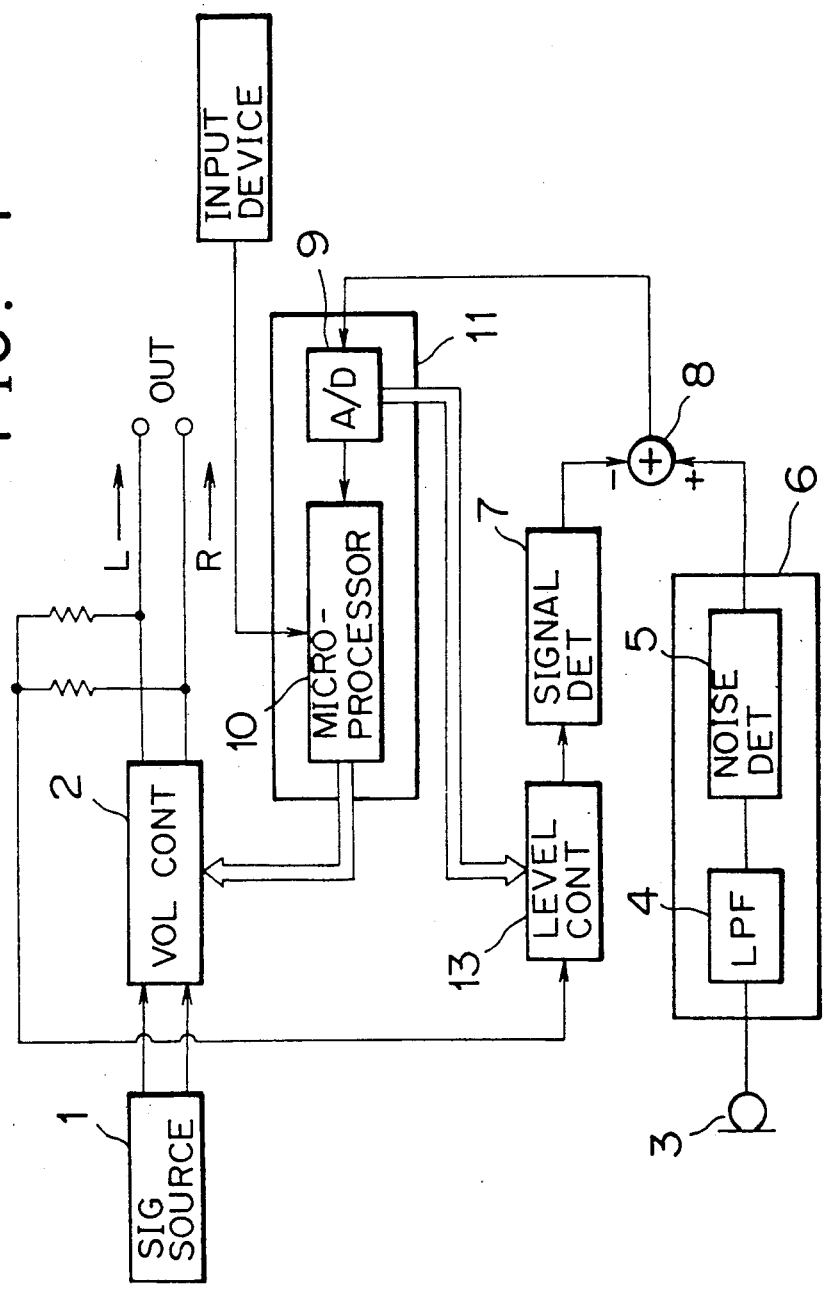
FIG. 1 is a block diagram showing an embodiment of the present invention.
Figure 2:
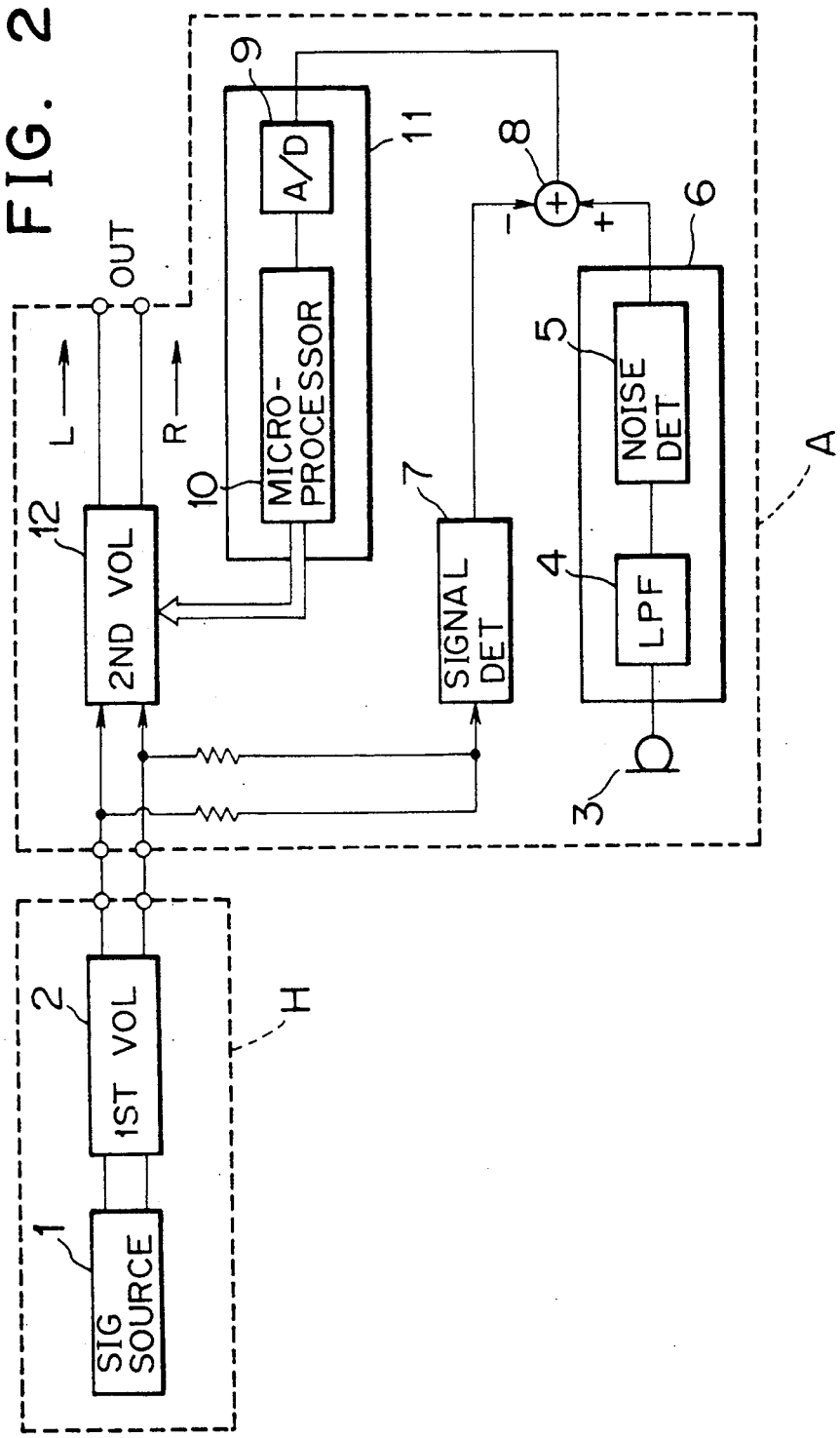
FIG. 2 is a block diagram showing a prior art apparatus.

Referring to FIG. 1, a microphone 3 is located at a suitable location in a car room to pick up environmental noise such as road noise and engine noise. The output of the microphone 3 is directed to a lowpass filter 4 which extracts only the low frequency component in the microphone output. The output of the filter 4 is then supplied to the noise detector 5 which provides a dc signal indicative of the level of the noise. The lowpass filter 4 and the noise detector 5 form a noise detecting unit 6. An audio signal source 1 supplies an audio signal from, for example, a tuner and a tape player to a volume control circuit 2 the output of which is fed to an OUT terminal as well as to a level control circuit 13. An audio signal detector 7 receives the output of the level control circuit 13 and provides a dc signal indicative of the level of the audio signal. The level control circuit 13 and the audio signal detector 7 form a level detecting unit 15. A relative level detecting circuit (subtracter) 8 compares the level of the output of detector 7 with that of the noise detector 5 to output a relative output (third signal), which in turn is converted into a digital signal by an A/D converter 9. A microprocessor 10 receives a command indicative of a set value of a desired speaker output level from the user through an external input device 14, and provides a first signal for adjusting the output level of the volume control circuit 2 back and forth through the set value in accordance with the output of the A/D converter 9. The adjustment of the output level of the volume control circuit 2 is not carried out in direct proportion to the change in environmental noise level but is performed by an amount much smaller than the change in the noise. The A/D converter 9 and the microprocessor 10 form a control unit 11. The A/D converter 9 also outputs a second signal which controls the level control circuit 13 such that the output of the circuit 13 is increased or decreased in accordance with the decrease or increase in the relative output from relative level detecting circuit 8. Since the level control circuit 13 receives the output of the volume control circuit 2, the output of the level control circuit 13 is adjusted back and forth through a level corresponding to the set value of the circuit 2. When the set value is relatively high, the output of the level control circuit 13 is adjusted back and forth through a relatively high level, whereas when the set value is relatively low, the output of the level control circuit 13 is adjusted back and forth through a relatively low level. It should be noted that the audio signal goes through only one volume control circuit as opposed to the prior art where the audio signal passes through the two volume circuits in series, being deteriorated its signal-to-noise ratio. The level control circuit needs not be of a low noise type since the output of the level control circuit 13 does not affect the sound quality from the speaker.

Operation

The relative level detecting circuit 8 outputs to the A/D converter 9 a signal (first signal) in accordance with the differences in level and polarity between the outputs of the noise detector 5 and the audio signal detector 7. The microprocessor 10 outputs a signal (first signal) to the volume control circuit 2 so as to set the desired speaker output level required by the user and control the output level of the volume control circuit 2 back and forth through the desired speaker output level in accordance with the output of the A/D converter 9. The A/D converter 9 also produces and sends to the level control circuit 13 a signal (second signal) such that the output of level control circuit 13 is decreased when the output of volume control circuit 2 is increased, and the output of level control circuit 13 is increased when the output of volume control circuit 2 is decreased, thereby maintaining the output level of the circuit 13 substantially at a level corresponding to the set value of the volume control circuit 2 without regard to the output level of the noise detector 5.

What is claimed is:

1. An on-vehicle automatic loudness control apparatus, comprising:
   a volume control means for receiving an audio signal from an audio signal source, said volume control means controlling an output level therefrom in accordance with a first signal supplied thereto;
   a level detecting means for receiving said output level from the volume control means, said level detecting means controlling an output level therefrom in accordance with a second signal supplied thereto;
   a noise detecting means for detecting environmental noise in a passenger space of a car to output a noise signal in accordance with the environmental noise level;
   a relative level detecting means for comparing said output level from the level detecting means with said noise signal to output a third signal indicative of a relative magnitude between the output level from the level detecting means and the noise signal; and
   a control means for outputting said first signal and said second signal in accordance with said third signal;
   wherein said second signal causes said output level from the level detecting means to decrease when said output level of the volume control means is increased, and said second signal causes said output from the level detecting means to increase when said output level from the volume control means is decreased.

2. An on-vehicle automatic loudness control apparatus according to claim 1, wherein said control means receives a signal from an external device for setting a desired speaker output level of said volume control means, said output level from the volume control means being adjusted back and forth through the set value in accordance with said third signal.

* * * * *